US006316362B1

United States Patent
Inoue

(10) Patent No.: US 6,316,362 B1
(45) Date of Patent: Nov. 13, 2001

(54) METHOD FOR MANUFACTURING SEMICONDUCTOR DEVICE

(75) Inventor: Ken Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/409,845

(22) Filed: Oct. 1, 1999

(30) Foreign Application Priority Data

Oct. 2, 1998 (JP) .................................................. 10-280869

(51) Int. Cl.$^7$ .................................................. H01L 21/44
(52) U.S. Cl. ............................ 438/682; 438/649; 438/592
(58) Field of Search .................................. 438/682, 683, 438/592, 585, 305, 306, 649

(56) References Cited

U.S. PATENT DOCUMENTS

| 4,378,628 | 4/1983 | Levinstein et al. ..................... 29/571 |
| 5,482,895 | 1/1996 | Hayashi et al. . |
| 5,780,361 | 7/1998 | Inoue ................... 438/683 |
| 6,150,248 | * 11/2000 | Sekiguchi et al. ................... 438/592 |
| 6,156,615 | * 12/2000 | Kepler ................................. 438/305 |
| 6,197,646 | 3/2001 | Goto et al. ............................ 438/301 |

FOREIGN PATENT DOCUMENTS

| 3-67334 | 10/1991 | (JP) . |
| 7-115198 | 5/1995 | (JP) . |
| 7-193237 | 7/1995 | (JP) . |
| 7-211903 | 8/1995 | (JP) . |
| 7-283168 | 10/1995 | (JP) . |
| 9-69497 | 3/1997 | (JP) . |
| 10-242079 | 9/1998 | (JP) . |
| 10-335265 | 12/1998 | (JP) . |

OTHER PUBLICATIONS

Lai et al., "A Novel Process to Form Cobalt Silicided P+ POly–Si Gates By BF2+ Implantation Into Bilayered CoSi/a–Si Films and Subsequent Anneal", IEEE Electron Devices Lett., vol. 19, p–159 (1998).*

Juang et al., "Shallow Junctions Formed by BF2+ Implantation into Thin CoSi Films and Rapid Thermal Annealing", Appl. Phys., vol. 76, p. 323 (1994).*

Cheng et al., "A Silicidation–Induced Process Consideration for Forming Scale–Down Silicided Junction", IEEE Electron Device Lett., vol. 15, No. 9, p. 342 (1994).*

Chen et al., "Thermal Stability and Dopant Drive–OUt Characteristics of Cosi2 Polycide Gates" J. Appl. Phys., vol. 73, p. 4712 (1993).*

* cited by examiner

Primary Examiner—Tuan H. Nguyen
(74) Attorney, Agent, or Firm—Foley & Lardner

(57) ABSTRACT

Disclosed herein is a method for manufacturing a semiconductor device having a high melting point metal silicide layer, especially a cobalt silicide layer. The uniformity of the metal silicide layer improves characteristics of the semiconductor device such as a heat resistance. In the present invention, the uniformity of the eventual metal silicide layer is improved by adjusting the degree of ion-implantation and thermal treatment of a precursor of the metal silicide layer.

7 Claims, 4 Drawing Sheets

METHOD FOR MANUFACTURING SEMICONDUCTOR DEVICE

BACKGROUND OF THE INVENTION (a) Field of the Invention

The present invention relates to a method for manufacturing a semiconductor device including a metal suicide layer having a high melting point metal overlying a semiconductor substrate, more in detail, to the method for manufacturing the semiconductor device of high reliability having the silicide layer of excellent thermal stability.

(b) Description of the Related Art

A silicide process is frequently used to manufacture a semiconductor device, and a variety of the suicide processes have been conventionally practiced. One of these silicide processes is described in JP-A-9(1997)-069497.

In the silicide process described therein, a field oxide film 401 is formed on a semiconductor substrate 400 by means of a known lithographic process and a known selective oxidation process as shown in FIG. 1A. Then, a gate oxide film 402 and a gate polysilicon layer 403 are sequentially grown on the active area surrounded by the field oxide film 401.

Then, a gate electrode 404 is formed by patterning the gate polysilicon layer by employing a photolithographic process and a dry etching method as shown in FIG. 1B.

A side wall 405 made of a silicon oxide film is formed on the side surface of the gate electrode 404 by employing a chemical vapor deposition (CVD) technique and an etching technique. An N-type gate electrode or a P-type gate electrode 406 is then formed by a photolithographic process, and a P-type diffused layer or an N-type diffused layer 407 is formed by an ion implantation process.

After a spontaneous oxide layer on the N-type or P-type gate electrode 406 and the P-type or N-type diffused layer 407 is removed and a cobalt layer having a thickness of 10 nm is formed on the semiconductor substrate 400 at a temperature of, for example, to 450° C. by sputtering in a vacuum ambient, the substrate is heated for 5 minutes in the vacuum ambient, thereby forming a $Co_2Si$ film having a thickness of about 15 nm on positions where the cobalt film and the silicon are in contact with each other.

Thereafter, in a nitrogen atmosphere, the $Co_2Si$ film is converted into a CoSi film having a thickness of 20 nm through phase transition by rapid thermal annealing (RTA) at 500° C. for 30 seconds.

The cobalt film left unreacted on the dielectric film is selectively removed by wet-etching with a mixed aqueous solution containing sulfuric acid and hydrogen peroxide. The wafer is then subject to the rapid thermal annealing at 800° C. for 10 seconds in a nitrogen atmosphere to conduct phase-transition from the CoSi film to a $Co_2Si$ film 408 having a thickness of about 35 nm as shown in FIG. 1C.

Since the surfaces of the gate electrode and the diffused layer are self-aligned to form the silicide in accordance with the above silicide process, a high-speed semiconductor device can be realized due to low resistance wiring.

The silicide process has an advantage of selective silicidation only in a desired Area.

With the advance of miniaturization and high integration of semiconductor devices, a so-called system-on-chip (SOC) device such as having a DRAM and a logic device on a single chip has an increasing demand.

In order to realize the SOC device, a variety of problems associated therewith must be solved. In order to mount a DRAM and a logic device on a single chip, a DRAM part and a logic part which are generally manufactured by processes entirely different from each other should be manufactured in common processes to decrease the number of fabrication steps and alleviate the complexity of the fabrication steps.

A method of forming suicide layers on the gate electrodes and the diffused layers of the DRAM part and the logic part in a self-aligning manner is employed for solving the above problems.

This process is called a salicide (self-aligned silicide) process which is widely utilized for a purpose of realization of transistors having high performance and high integration used in a logic device.

This process enables simultaneous or sequential formation of the DRAM part and the logic part to simplify the steps and to reduce the number of the steps.

However, in this process, a new problem arises. Even when the silicides are simultaneously formed on the gate electrodes and the diffused layers of the DRAM part and the logic part, formation of capacitors in the DRAM is ordinarily conducted after the formation of the silicide of the gate electrode.

Since a high temperature treatment is conducted in the capacitor forming step after the formation of the silicide film, the silicide film is coagulated during the capacitor forming step to increase the resistance thereof and has poor heat resistance.

SUMMARY OF THE INVENTION

In view of the foregoing, an object of the present invention is to provide a method for manufacturing a semiconductor device having a silicide film of excellent heat resistance and high reliability.

The present invention provides a method for manufacturing a semiconductor including the steps of: forming a gate electrode layer made of polysilicon or amorphous silicon overlying a semiconductor substrate; forming a gate electrode by etching the gate electrode layer; forming a side wall on a side surface of the gate electrode, consecutively ion-implanting and heat-treating, the gate electrode and a surface portion of the semiconductor substrate to form the gate electrode as an N-type or P-type gate electrode and to form the surface portion as a diffused layer; forming a metal silicide layer on the N-type or P-type gate electrode and the diffused layer.

The present invention can be modified by the step of ion-implantation into the gate electrode and/or the step of thermally treating the gate electrode.

In accordance with the method for manufacturing the semiconductor device, the ion-implantation and/or the thermal treatment of the gate electrode and the diffused layer to optimize the surface impurity concentration thereof enables to improve the heat resistance of the metal silicide film formed on the gate electrode and the diffused layer, thereby providing a semiconductor device having high reliability.

The above and other objects, features and advantages of the present invention will be more apparent from the following description.

PREFERRED EMBODIMENTS OF THE INVENTION

Now, the present invention is more specifically described with reference to accompanying drawings.

Embodiment 1

Figure 1A:
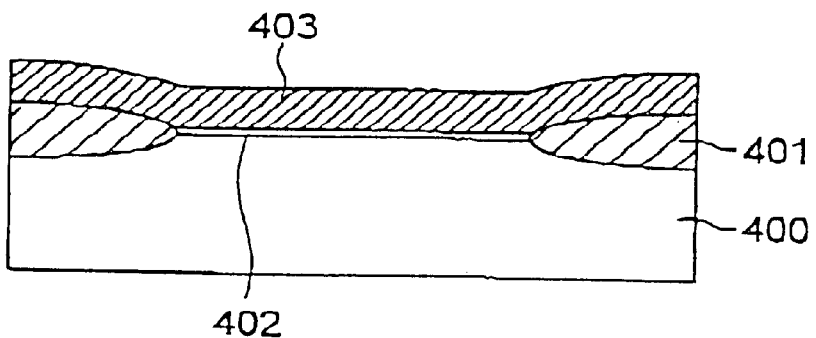
FIGS. 1A to 1C are vertical sectional views sequentially showing a conventional method of manufacturing a semiconductor device.
Figure 1B:
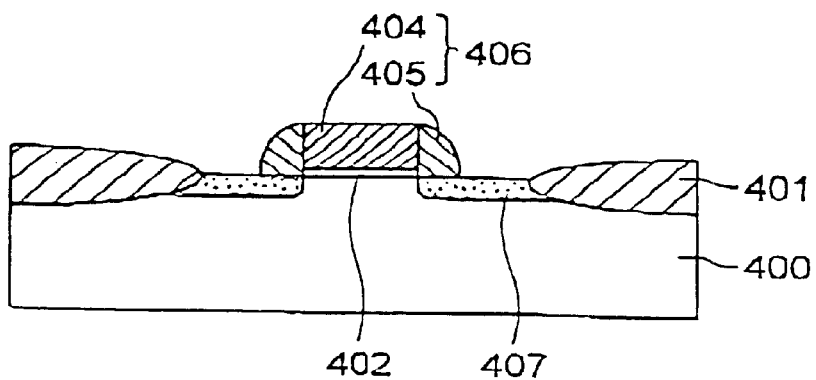
Figure 1C:
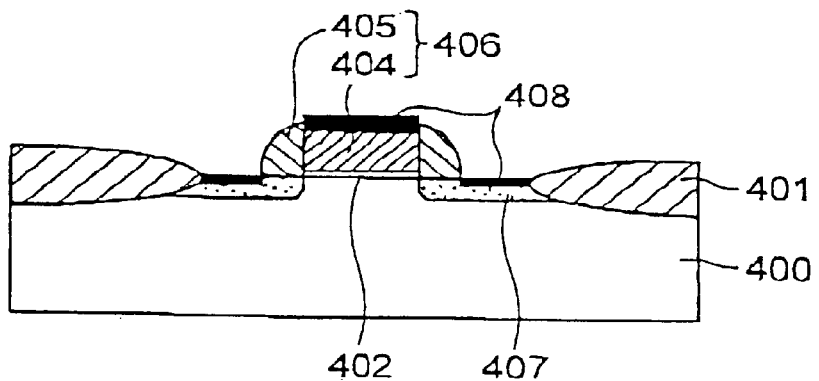
Figure 2A:
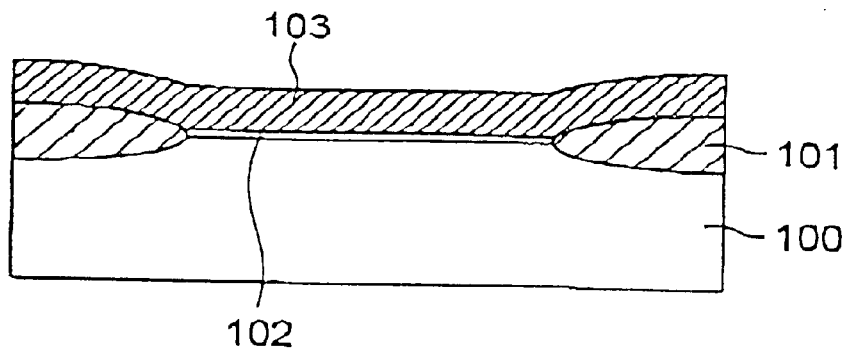
FIGS. 2A to 2C are vertical sectional views sequentially showing one embodiment of a method of manufacturing a semiconductor device in accordance with the present invention.

At first, a field oxide film 101 functioning as a dielectric film is formed on a semiconductor substrate 100 as shown in FIG. 2A. Then, a gate oxide film 102 and a gate polysilicon layer 103 are sequentially grown on the active area surrounded by the field oxide film 101.

Figure 2B:
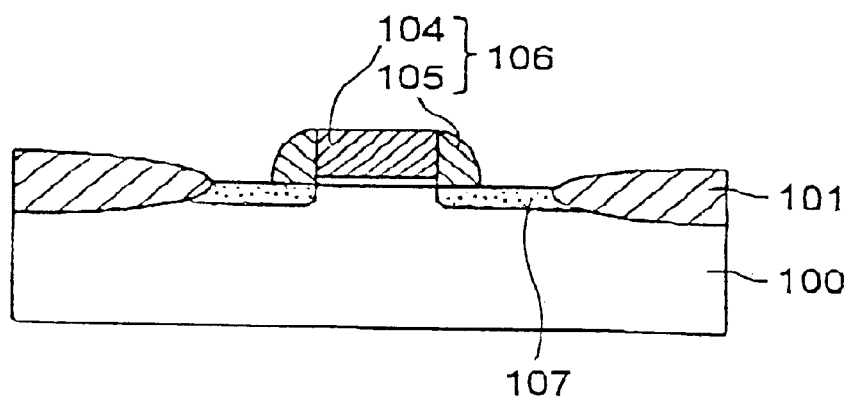

Then, a gate electrode 104 is formed by patterning the gate polysilicon layer 103 by employing a photolithographic process and a dry etching method known in the art, as shown in FIG. 2B.

A side wall 105 made of a,silicon oxide film is formed on the side surface of the gate electrode 104 by employing a CVD technique and an etching technique known in the art.

An N-type gate electrode or a P-type gate electrode 106 and an N-type diffused layer or a P-type diffused layer 107 are then formed by conducting the photolithographic process, an ion-implantation process and a thermal treatment for activating impurities.

The ion-implantation and the thermal treatment are conducted to make impurity concentrations of the surfaces of the diffused layer and the gate electrode in a range, for example, between $1 \times 10^{21}$ atoms/cm$^2$ and $1 \times 10^{22}$ atoms/cm$^2$.

Ion-implantation of, for example, arsenic (As) is conducted at a dosage of $5 \times 10^{15}$/cm$^2$ and an acceleration energy of 30 KeV, followed by RTA thereof at 1000° C. for 10 seconds. Subsequently, ion-implantation of boron (B) is conducted at a dosage of $5 \times 10^{15}$/cm$^2$ and an acceleration energy of 5 KeV, followed by RTA thereof at 1000° C. for 10 seconds.

In this manner, a N-type gate electrode or P-type gate electrode 106 and a N-type diffused layer or P-type diffused layer 107 can be formed having a surface concentration between $1 \times 10^{21}$ atoms/cm$^2$ and $1 \times 10^{22}$ atoms/cm$^2$.

Ordinarily, this ion-implantation is conducted to control the characteristics of transistors and not to control the heat resistance of the silicide.

In the present invention, the surface impurity concentration is made to be higher for improving the heat resistance of the silicide.

Figure 2C:
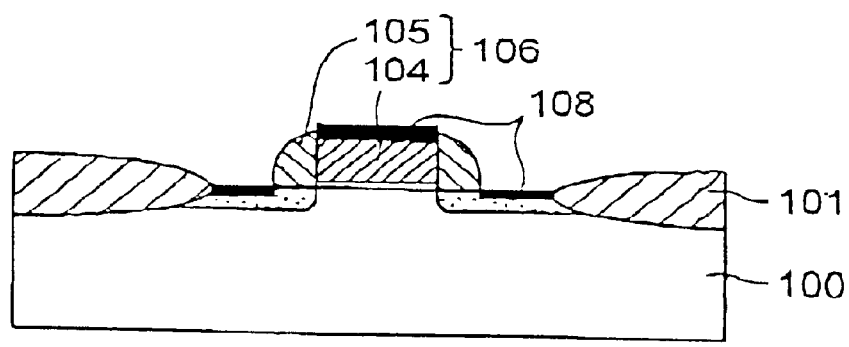

Thereafter, as shown in FIG. 2C, a spontaneous oxide film formed on the silicon surfaces of the N-type gate electrode or P-type gate electrode 106 and the P-type diffused layer or N-type diffused layer 107 is removed, a cobalt (Co) layer having a thickness of 15 nm is deposited by sputtering at a substrate temperature of, for example, 400° C., and the substrate is thermally treated for 2 minutes in the same reduced pressure atmosphere At this time, a Co$_2$Si film having a thickness of about 25 nm is formed on the position where the cobalt film and the silicon are in direct contact with each other.

Thereafter, in a nitrogen atmosphere, the Co$_2$Si film is converted into a CoSi film having a thickness of 30 nm through phase transition by rapid thermal annealing (RTA) at 625° C. for 50 seconds.

The cobalt film left unreacted on the dielectric film is selectively removed by wet-etching with a mixed aqueous solution containing hydrochloric acid and hydrogen peroxide. The wafer is then subjected to RTA at 800° C. for 10 seconds in a nitrogen atmosphere to conduct phase-transition from the CoSi film to a CoSi$_2$ film 108 having a thickness of about 50 nm.

For better understanding of the present invention, the principle of coagulation of the silicide film is described hereafter.

The silicide film is microscopically formed by a group of grains having the same crystallizabilty, and an interface between the adjacent grains is called a grain boundary. The coagulation of the silicide film is a phenomenon in which silicon in the suicide film is deposited on the grain boundary to make the resistance of the grain boundary higher.

The heat resistance of the silicide film is generally influenced by a thickness thereof, a wiring width and crystallizabilty of the underlying silicon.

The heat resistance is noticeably deteriorated with decrease of the thickness of the silicide. Since the depth of the diffused layer is reduced with the advance of miniaturization and high integration of the semiconductor devices to proceed with the thinning of the silicide layer, the deterioration of the heat resistance becomes problematic even though the formation of the suicide film itself is possible.

Reduction in the wiring width of the gate electrode and the diffused layer is a cause of the deterioration in the heat resistance of the devices There are two kinds of underlying silicon one of which is a polycrystalline silicon forming a gate electrode and the other of which is a single crystal silicon forming a diffused layer. It is known that the heat resistance of the suicide film formed on the gate electrode made of the polycrystalline silicon is poor.

The reasons thereof are considered to be as follows. The grains of the silicide of the polycrystalline silicon are more ununiformly formed than those of the single-crystal silicon due to the existence of the grain boundary of the silicon grains in the polycrystalline silicon, and the bonding strength between the polycrystalline silicon and the silicide interface is weaker than that between the single-crystal silicon and the salicide interface, and the silicon in the silicide film is liable to penetrate the boundary to the underlying silicon.

The heat resistance of the silicide film is known to be changed depending on materials of the silicides. The material most widely employed is a titanium silicide. Since the titanium silicide film is difficult to be formed on a fine wiring, the employment of the cobalt silicide which is easily formed on the fine wiring is scheduled in place of the titanium silicide.

Since the crystal structure of the cobalt silicide is similar to that of silicon differently from the titanium silicide, and the lattice constants of the cobalt silicide differ from those of the silicon only by 1.2%, the lattice matching therebetween is excellent. As a result, the cobalt silicide may be epitaxially grown on the underlying silicon, and the epitaxial growth thermally stabilizes the CoSi$_2$/Si interface to expect the improvement of the heat resistance.

A process of forming the cobalt silicide will be described more in detail.

The phase-transition of the cobalt silicide film is known to proceed in turn of Co→Co$_2$Si→CoSi→CoSi$_2$. The silicide reaction of Co→Co$_2$Si occurring at a temperature of about 350 to 450° C. is initiated by the diffusion of the cobalt, and this cobalt is called the diffusion species of this reaction.

The silicide reaction of $Co_2Si$ or Co→CoSi occurs at a temperature of about 400 to 600° C. of which the diffusion species is the silicon. The suicide reaction of CoSi→$CoSi_2$ occurs at a temperature beyond 650° C. of which the diffusion species is the cobalt.

The cobalt silicide is known to be generated by way of such a complicated reaction system. The epitaxial growth already mentioned occurs in the final step of converting CoSi into $CoSi_2$. Since the crystal structures of $Co_2Si$ and CoSi are completely different from that of Si, substantially no epitaxial growth occurs during the formation of $Co_2Si$ and CoSi.

The ratio of the eventual epitaxial growth is largely dependent on how uniform the $Co_2Si$ or CoSi film is formed during the initial low temperature reaction. Detailed experimental results obtained by the present inventor reveal that the uniform formation of the first $Co_2Si$ film is necessary for increasing the ratio of the epitaxial growth of the $CoSi_2$ film.

As mentioned earlier, the reactions from Co to $Co_2Si$ and Co to CoSi may simultaneously occur at the Co/Si interface because the temperature ranges of the reactions are close to each other. When the simultaneous reactions occur, the ratio of the epitaxial growth is reduced to deteriorate the heat resistance because the $Co_2Si$ film is not uniformly formed.

Since the silicon is the diffusion species in the reaction from Co to CoSi as mentioned earlier, the reaction initiation temperature and the reaction rate are dependent on the concentration, especially the surface concentration, of the impurities added to the diffused layer and the gate electrode.

Detailed experimental results obtained by the present inventor reveal that the reaction from Co to CoSi is suppressed with the increase of the surface impurity concentration of the diffused layer and the gate electrode.

Accordingly, the optimization of the surface impurity concentration and of the thermal treatment enables the control of occurring, at the Co/Si interface, only the reaction from Co to $Co_2Si$ in which the diffusion species is the cobalt. The uniform formation of the $Co_2Si$ film can be realized by controlling the reaction at the Co/Si interface in this manner. As a result, the ratio of the epitaxial growth of the eventually formed $Co_2Si$ film can be elevated to realize the cobalt silicide ($Co_2Si$), film having the high heat resistance.

Embodiment 2

Figure 3A:
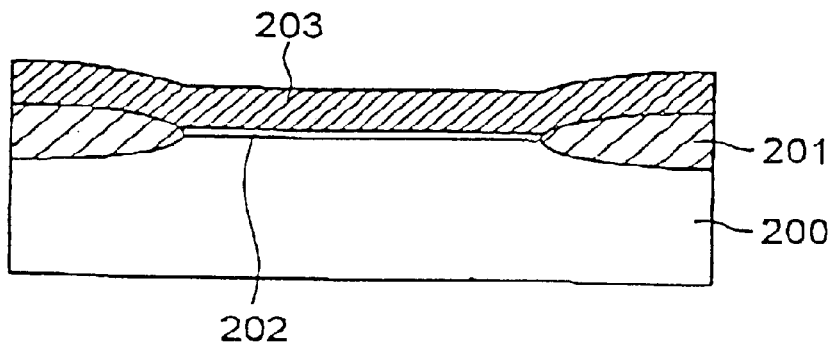
FIGS. 3A to 3C are vertical sectional views sequentially showing another embodiment of a method of manufacturing a semiconductor device in accordance with the present invention.

At first, a field oxide film 201 functioning as a filed dielectric film is formed on the semiconductor substrate 200 as shown in FIG. 3A. Then, a gate oxide film 202 and a gate polysilicon layer 203 are sequentially grown on the active area surrounded by the field oxide film 201.

When the N-type gate electrode is formed by employing an ion-implantation process, ionimplantation of arsenic (As) is conducted, for example, under conditions of $1\times10^{15}/cm^2$ and 30 KeV. When the P-type gate electrode is formed, ion-implantation of boron (B) or $BF_2$ is conducted, for example, under conditions of $1\times10^{15}/cm^2$ and 50 KeV or under conditions of $1\times10^{15}/cm^2$ and 20 KeV, respectively.

Then, a gate electrode 204 is formed by patterning the gate polysilicon layer 203 by employing a photolithography process and a dry etching method already known as shown in FIG. 32B.

A side wall 205 made of a silicon oxide film is formed on the side surface of the gate electrode 204 by employing a CVD technique and an etching technique already known.

An N-type gate electrode or a P-type gate electrode 206 and an N-type diffused layer or a P-type diffused layer 207 are then formed by conducting the photolithography process, an ion-implantation process and a thermal treatment for activating impurities.

The ion-implantation and the thermal treatment are conducted to make impurity concentrations of the surfaces of the diffused layer and the gate electrode in a range between $1\times10^{21}$ atoms/$cm^2$ and $1\times10^{22}$ atoms/$cm^2$. Ion-implantations of arsenic (As) and boron (B) can be conducted similarly to those of Embodiment 1.

In this manner, the N-type gate electrode or the P-type gate electrode 206 and the N-type diffused layer or the P-type diffused layer 207 can be formed.

Especially, in Embodiment 2, since the ion-implantation and the thermal treatment for forming the gate electrode and the diffused layer are separately implemented, the characteristics of the transistor can be improved while elevating the heat resistance of the cobalt silicide.

Figure 3B:
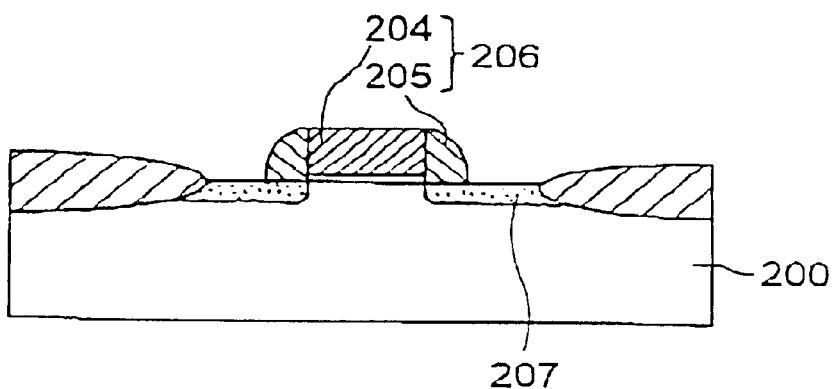
Figure 3C:
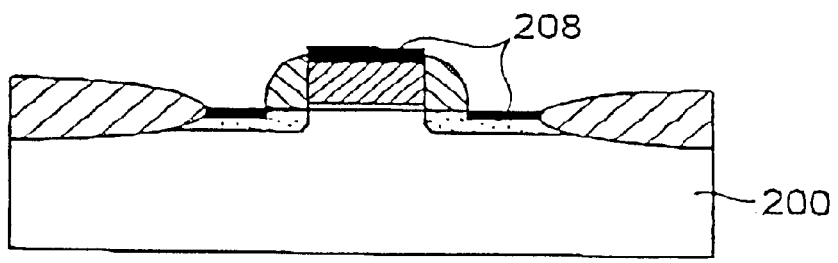

After, as shown in FIG. 3B, a spontaneous oxide film of the silicon surface on the N-type gate electrode or the P-type gate electrode 206 and the P-type diffused layer or the N-type diffused layer 207 is removed, a cobalt (Co) layer having a thickness of 15 nm is formed on the semiconductor substrate which is heated to, for example, 400° C. by sputtering, and the substrate is thermally treated for 2 minutes in the same reduced pressure atmosphere.

At this time, a $Co_2Si$ film having a thickness of about 25 nm is formed on a position where the cobalt film and the silicon are in contact with each other.

Thereafter, in a nitrogen atmosphere, the $Co_2Si$ film is converted into a CoSi film having a thickness of 30 nm through phase transition by RTA at 625° C. for 30 seconds.

The cobalt film left unreacted on the dielectric film is selectively removed by wet-etching with a mixed aqueous solution containing hydrochloric acid and hydrogen peroxide. The wafer is then subject to RTA at 800° C. for 10 seconds in a nitrogen atmosphere to conduct phase-transition from the CoSi film to a $Co_2Si$ film 208 having a thickness of about 50 nm.

Figure 4A:
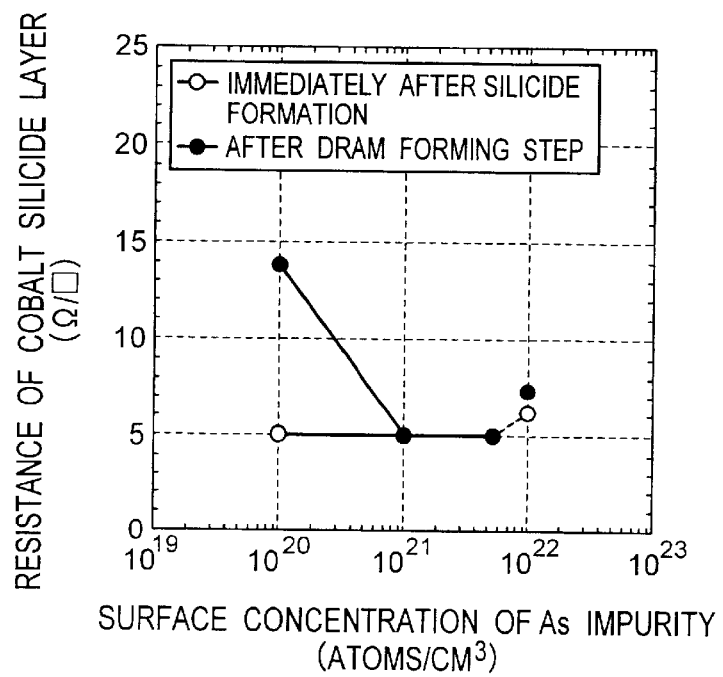
FIG. 4A is a graph showing a relation between a surface concentration of an arsenic impurity and a resistance of a cobalt silicide layer.
Figure 4B:
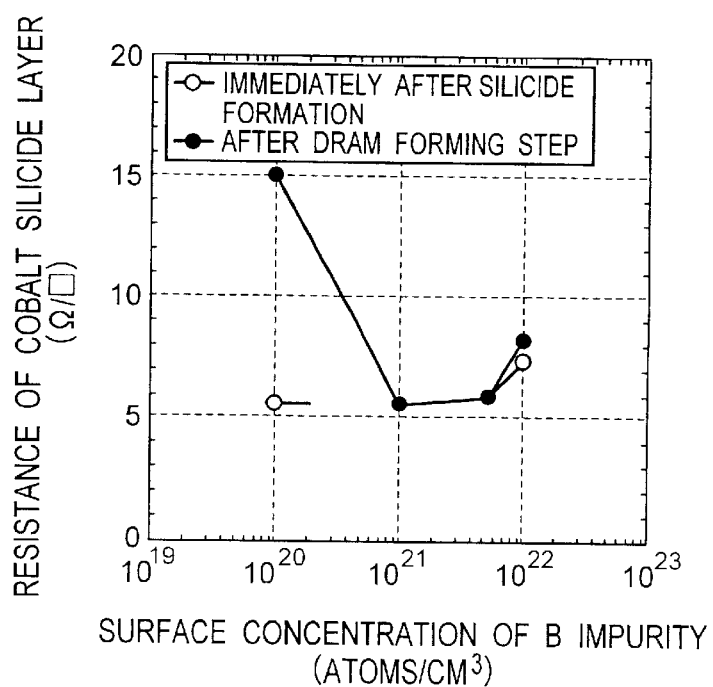
FIG. 4B is a graph showing a relation between a surface concentration of a boron impurity and a resistance of a cobalt silicide layer.

In graphs in FIGS. 4A and 4B, dependencies of resistances of cobalt silicide layers on surface impurity concentrations of arsenic and boron are shown, respectively.

The resistance of the cobalt silicide layer is measured by employing a pattern having a gate electrode width of 0.25 micrometer and a length of 100 micrometers. White circles and black circles in these graphs indicate resistance values of the layers immediately after the formation of the cobalt silicide and after the DRAM formation step upon the cobalt silicide formation, respectively. In the DRAM formation step, thermal treatments are conducted at 750° C. for 1 hour and at 900° C. for 10 seconds.

The layer resistance immediately after the formation of the silicide scarcely increases in case that the surface concentration is $1\times10^{22}$ atom/$cm^2$, but the layer resistances of lower values are obtained in the other cases. On the other hand, the layer resistance after the DRAM formation step is highest at a concentration of $1\times10^{20}$ atoms/$cm^2$, and the coagulation of the silicide film is proved to occur due to the thermal treatment in the DRAM formation step, and the layer resistance after the DRAM formation step is higher than that immediately after the formation of the silicide at the concentration of $1\times10^{22}$ atoms/$cm^2$. This tendency is independent of the impurity elements (As and B).

When the surface impurity is as low as to $1\times10^{22}$ atoms/$cm^2$, the coagulation accelerates the reactions from Co to $Co_2Si$ and from Co to CoSi during the high temperature sputtering resulting decrease of a ratio of epitaxial growth of the $CoSi_2$ film to deteriorate the heat resistance.

When, on the other hand, the surface impurity is as high as to $1\times10^{22}$ atoms/$cm^2$, only a reaction from Co to $Co_2Si$ occurs, but the reaction rate thereof is lowered because the impurity concentration is too high. As a result, part of a cobalt film remains unreacted because all the cobalt cannot react during the sputtering and the heating under vacuum.

Once the unreacted cobalt film is exposed to atmosphere to be oxidized, the silicide reaction thereof does not occur even in the RTA step at about 600° C. and is etched together with the unreacted cobalt film on the dielectric film by wet-etching of the latter. As a result, a thinner $CoSi_2$ film is formed which deteriorates the heat resistance. However, the $CoSi_2$ film has a higher heat resistance than that when the surface impurity concentration is low.

As apparent from the above description concerning the surface impurity concentration, the semiconductor device having high reliability can be obtained by improving the heat resistance of the metal silicide film, especially, the cobalt silicide film.

Since the above embodiments are described only for examples, the present invention is not limited to the above embodiments and various modifications or alternations can be easily made therefrom by those skilled in the art without departing from the scope of the present invention.

What is claimed is:

1. A method for manufacturing a semiconductor including the steps of:

forming a gate electrode layer made of polysilicon or amorphous silicon overlaying a semiconductor substrate;

forming a gate electrode by etching said gate electrode layer;

forming a side wall on a side surface of said gate electrode;

consecutively ion-implanting and thermally treating said gate electrode and a surface portion of said semiconductor substrate to form the gate electrode as an N-type or P-type gate electrode and to form the surface portion as a diffused layer;

forming a metal silicide layer on said N-type or P-type gate electrode and said diffused layer;

wherein said gate electrode and said diffused layer having a surface impurity concentration between $1 \times 10^{21}$ atoms/cm$^3$ and $1 \times 10^{22}$ atoms/cm$^3$ are formed in the ion-implantation step.

2. The method for manufacturing the semiconductor device as defined in claim 1, wherein said metal silicide layer is a cobalt silicide layer.

3. The method for manufacturing the semiconductor device as defined in claim 1, wherein arsenic is implanted as an N-type impurity, and boron and/or $BF_2$ is implanted as a P-type impurity at a dosage range between $1 \times 10^{15}$ atoms/cm$^2$ and $1 \times 10^{16}$ atoms/cm$^2$ in said ion-implantation step.

4. The method for manufacturing the semiconductor device as defined in claim 1, wherein the method further includes, after said side wall forming step, the steps of:

forming a cobalt film overlaying said semiconductor substrate by sputtering;

conducting a thermal treatment to the wafer;

conducting a first rapid thermal annealing to said wafer at a temperature over 400° C. and less than 650° C. in an inert gas atmosphere;

selectively removing only an unreacted cobalt film by wet-etching; and conducting a second rapid thermal annealing to said wafer at a temperature over 650° C. in an inert gas atmosphere to convert a CoSi film on said N-type or P-type gate electrode and said diffused layer into a CoSi2 film.

5. A method of for manufacturing a semiconductor device comprising the steps of:

forming a gate electrode layer made of polysilicon or amorphous silicon on a semiconductor substrate;

implanting an ion to said gate electrode layer;

forming a gate electrode by etching said gate electrode layer;

conducting a thermal treatment of said wafer;

forming a side wall on a side surface of said gate electrode;

consecutively ion-implanting and thermally treating said gate electrode and a surface portion of said semiconductor substrate to form the gate electrode as an N-type or P-type gate electrode and to form the surface portion as a diffused layer;

forming a metal silicide layer on said N-type or P-type gate electrode and said diffused layer; and wherein said N-type or P-type gate electrode and said diffused layer having a surface impurity concentration between $1 \times 10^{21}$ atoms/cm$^3$ and $1 \times 10^{22}$ atoms/cm$^3$ are formed in said gate electrode and diffused layer forming step.

6. The method for manufacturing the semiconductor device as defined in claim 5, wherein arsenic is implanted as an N-type impurity, and boron is implanted as a P-type impurity at a concentration range between $1 \times 10^{15}$ atoms/cm$^2$ and $1 \times 10^{16}$ atoms/cm$^2$ are formed in said gate electrode and diffused layer forming step.

7. The method for manufacturing the semiconductor device as defined in claim 5, wherein the method further includes, after said side wall forming step, the steps of:

forming a cobalt film overlaying said semiconductor substrate by sputtering, conducting a thermal treatment to the wafer;

conducting a first rapid thermal treatment to said wafer at a temperature over 400° C. and less than 650° C. in an inert gas atmosphere;

selectively removing only an unreacted cobalt film by wet-etching; and conducting a second rapid thermal treatment to said wafer at a temperature over 650° C. in an inert gas atmosphere to convert a CoSi film on said N-type or P-type gate electrode and said diffused layer into a CoSi2 film.

* * * * *